US010872894B2

(12) United States Patent
Juengling

(10) Patent No.: US 10,872,894 B2
(45) Date of Patent: Dec. 22, 2020

(54) MEMORY CIRCUITRY HAVING A PAIR OF IMMEDIATELY-ADJACENT MEMORY ARRAYS HAVING SPACE LATERALLY-THERE-BETWEEN THAT HAS A CONDUCTIVE INTERCONNECT IN THE SPACE

(71) Applicant: Micron Technology, Inc., Boise, ID (US)

(72) Inventor: Werner Juengling, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/044,887

(22) Filed: Jul. 25, 2018

(65) Prior Publication Data

US 2019/0067288 A1 Feb. 28, 2019

Related U.S. Application Data

(60) Provisional application No. 62/551,731, filed on Aug. 29, 2017.

(51) Int. Cl.
*G11C 5/06* (2006.01)
*H01L 27/108* (2006.01)
(Continued)

(52) U.S. Cl.
CPC .......... *H01L 27/108* (2013.01); *G11C 11/408* (2013.01); *G11C 11/4085* (2013.01); *G11C 11/4097* (2013.01)

(58) Field of Classification Search
CPC .. G11C 11/408; G11C 11/4097; H01L 27/108
(Continued)

(56) References Cited

U.S. PATENT DOCUMENTS 4,103,342 A 7/1978 Miersch et al.
4,554,570 A 11/1985 Jastrzebski
(Continued)

FOREIGN PATENT DOCUMENTS

EP 0706187 4/1996
JP H 03-205867 9/1991
(Continued)

OTHER PUBLICATIONS

Chun et al.; "A 3T Gain Cell Embedded DRAM Utilizing Preferential Boosting for High Density and Low Power On-Die Caches"; IEEE Journal of Solid-State Circuits; vol. 46, No. 6, Jun. 2011; pp. 1495-1505.
(Continued)

*Primary Examiner* — Connie C Yoha
(74) *Attorney, Agent, or Firm* — Wells St. John P.S.

(57) ABSTRACT

In some embodiments, memory circuitry comprises a pair of immediately-adjacent memory arrays having space laterally there-between. The memory arrays individually comprise memory cells individually having upper and lower elevationally-extending transistors and a capacitor elevationally there-between. The memory arrays comprise individual rows that (a) have an upper access line above and directly electrically coupled to a lower access line, and (b) are directly electrically coupled to one another across the space. The lower access line in one of the rows extends across the space from one of the memory arrays to the other of the memory arrays. Another of the rows comprises a conductive interconnect extending across a portion of the space. The conductive interconnect includes a horizontally-extending portion within the space that is laterally offset from the another row. Other aspects and implementations are disclosed.

20 Claims, 11 Drawing Sheets

(51) Int. Cl.
*G11C 11/408* (2006.01)
*G11C 11/4097* (2006.01)

(58) Field of Classification Search
USPC .................................. 365/72, 230.03, 149
See application file for complete search history.

(56) References Cited

U.S. PATENT DOCUMENTS

| | | | |
|---|---|---|---|
| 5,066,607 A | 11/1991 | Banerjee | |
| 5,299,155 A | 3/1994 | Yanagi | |
| 5,389,810 A | 2/1995 | Agata | |
| 5,398,200 A | 3/1995 | Mazure et al. | |
| 5,571,743 A | 11/1996 | Henkels et al. | |
| 5,586,078 A * | 12/1996 | Takase | G06F 12/0893 365/230.03 |
| 5,646,900 A | 7/1997 | Tsukude et al. | |
| 5,830,791 A | 11/1998 | Lee et al. | |
| 5,898,608 A | 4/1999 | Hirano et al. | |
| 6,028,806 A * | 2/2000 | Waller | G11C 5/063 365/230.01 |
| 6,141,286 A * | 10/2000 | Vo | G11C 7/10 365/230.03 |
| 6,154,387 A | 11/2000 | Takata | |
| 6,483,737 B2 | 11/2002 | Takeuchi et al. | |
| 6,563,727 B1 | 5/2003 | Roth et al. | |
| 6,710,465 B2 | 3/2004 | Song et al. | |
| 6,720,609 B2 | 4/2004 | Deboer et al. | |
| 6,744,087 B2 | 6/2004 | Misewich | |
| 6,961,271 B2 | 11/2005 | Jeon et al. | |
| 7,164,595 B1 | 1/2007 | Shore et al. | |
| 7,330,388 B1 | 2/2008 | Chapman et al. | |
| 7,378,702 B2 | 5/2008 | Lee | |
| 7,408,218 B2 | 8/2008 | Akiyama et al. | |
| 7,558,097 B2 | 7/2009 | Khellah et al. | |
| 7,697,318 B2 | 4/2010 | Fukuda et al. | |
| 8,212,311 B2 | 7/2012 | Masuoka et al. | |
| 8,394,699 B2 | 3/2013 | Haller et al. | |
| 8,866,208 B2 | 10/2014 | Lee | |
| 9,184,218 B2 | 11/2015 | Zhang et al. | |
| 9,343,507 B2 | 5/2016 | Takaki | |
| 9,378,780 B1 | 6/2016 | Chang et al. | |
| 9,419,003 B1 | 8/2016 | Colinge et al. | |
| 9,698,272 B1 | 7/2017 | Ikeda et al. | |
| 10,020,311 B1 * | 7/2018 | Li | H01L 27/10897 |
| 10,095,503 B2 | 10/2018 | Kim et al. | |
| 10,157,926 B2 | 12/2018 | Yang et al. | |
| 10,355,002 B2 | 7/2019 | Sills | |
| 10,381,357 B2 | 8/2019 | Karda et al. | |
| 2001/0053088 A1 | 12/2001 | Forbes | |
| 2002/0044477 A1 | 4/2002 | Takeuchi et al. | |
| 2002/0093865 A1 * | 7/2002 | Agata | G11C 11/406 365/222 |
| 2002/0113260 A1 | 8/2002 | Yang et al. | |
| 2002/0140106 A1 | 10/2002 | Kurjanowicz | |
| 2003/0087499 A1 | 5/2003 | Lane et al. | |
| 2003/0169616 A1 | 9/2003 | Noro | |
| 2003/0173593 A1 | 9/2003 | Miyatake | |
| 2003/0185041 A1 | 10/2003 | Takahashi et al. | |
| 2003/0202391 A1 | 10/2003 | Nishimura et al. | |
| 2003/0234413 A1 | 12/2003 | Sberno et al. | |
| 2004/0062101 A1 | 4/2004 | Kasuga | |
| 2004/0090810 A1 | 5/2004 | Sakuma | |
| 2004/0151020 A1 | 8/2004 | Beer | |
| 2004/0174733 A1 | 9/2004 | Kirihata et al. | |
| 2004/0232497 A1 | 11/2004 | Akiyama | |
| 2004/0252542 A1 | 12/2004 | Hoya et al. | |
| 2006/0028859 A1 | 2/2006 | Forbes | |
| 2006/0046424 A1 | 3/2006 | Chance et al. | |
| 2006/0138466 A1 | 6/2006 | Choi | |
| 2006/0211194 A1 | 9/2006 | Haller | |
| 2007/0034928 A1 | 2/2007 | Cook et al. | |
| 2007/0161179 A1 | 7/2007 | Lee | |
| 2007/0295995 A1 | 12/2007 | Yun | |
| 2009/0008691 A1 | 1/2009 | Lee et al. | |
| 2009/0108881 A1 | 4/2009 | Wilson | |
| 2009/0168489 A1 | 7/2009 | Madan et al. | |
| 2009/0212338 A1 | 8/2009 | Benson | |
| 2010/0165704 A1 | 7/2010 | Wu et al. | |
| 2010/0238697 A1 | 9/2010 | Juengling | |
| 2010/0264484 A1 | 10/2010 | Masuoka et al. | |
| 2010/0295110 A1 | 11/2010 | Takaishi | |
| 2012/0153371 A1 | 6/2012 | Chen et al. | |
| 2013/0099305 A1 | 4/2013 | Kim et al. | |
| 2013/0161607 A1 | 6/2013 | Yoneda | |
| 2013/0221356 A1 | 8/2013 | Yamazaki | |
| 2013/0235641 A1 | 9/2013 | Iwaki | |
| 2013/0235642 A1 | 9/2013 | Heineck et al. | |
| 2013/0286734 A1 | 10/2013 | Chang | |
| 2014/0035018 A1 | 2/2014 | Lee | |
| 2014/0054718 A1 | 2/2014 | Karda et al. | |
| 2014/0220749 A1 | 8/2014 | Rutter | |
| 2015/0041885 A1 | 2/2015 | Yoshida et al. | |
| 2015/0078056 A1 | 3/2015 | Liu | |
| 2015/0102282 A1 | 4/2015 | Zhang et al. | |
| 2015/0318285 A1 | 11/2015 | Zhang | |
| 2016/0071843 A1 | 3/2016 | Kadoya | |
| 2016/0079247 A1 | 3/2016 | Lim et al. | |
| 2017/0053920 A1 | 2/2017 | Kim et al. | |
| 2018/0061835 A1 | 3/2018 | Yang et al. | |
| 2018/0061840 A1 | 3/2018 | Sills | |
| 2018/0197864 A1 | 7/2018 | Sills | |

FOREIGN PATENT DOCUMENTS

| | | |
|---|---|---|
| JP | H 08-147983 | 6/1996 |
| JP | 2003-303901 | 10/2003 |
| JP | 2011-142256 | 7/2011 |
| KR | 10-2007-0070021 | 7/2007 |
| KR | 10-2016-0032559 | 3/2016 |
| SR | 18850297 | 7/2020 |
| TW | 201025352 | 7/2010 |
| TW | I402915 | 7/2013 |
| WO | WO PCT/US2018/041312 | 11/2018 |

OTHER PUBLICATIONS

Henkels et al.; "Large-Signal 2T, 1C DRAM Cell: Signal and Layout Analysis"; IEEE Journal of Solid-State Circuits; vol. 29, No. 7; Jul. 1994; pp. 829-832.

Hewes, "Circuit Diagrams", available online at https://electronicsclub.info/circuitdiagrams.htm, Dec. 14, 2018, pp. 1-3.

* cited by examiner

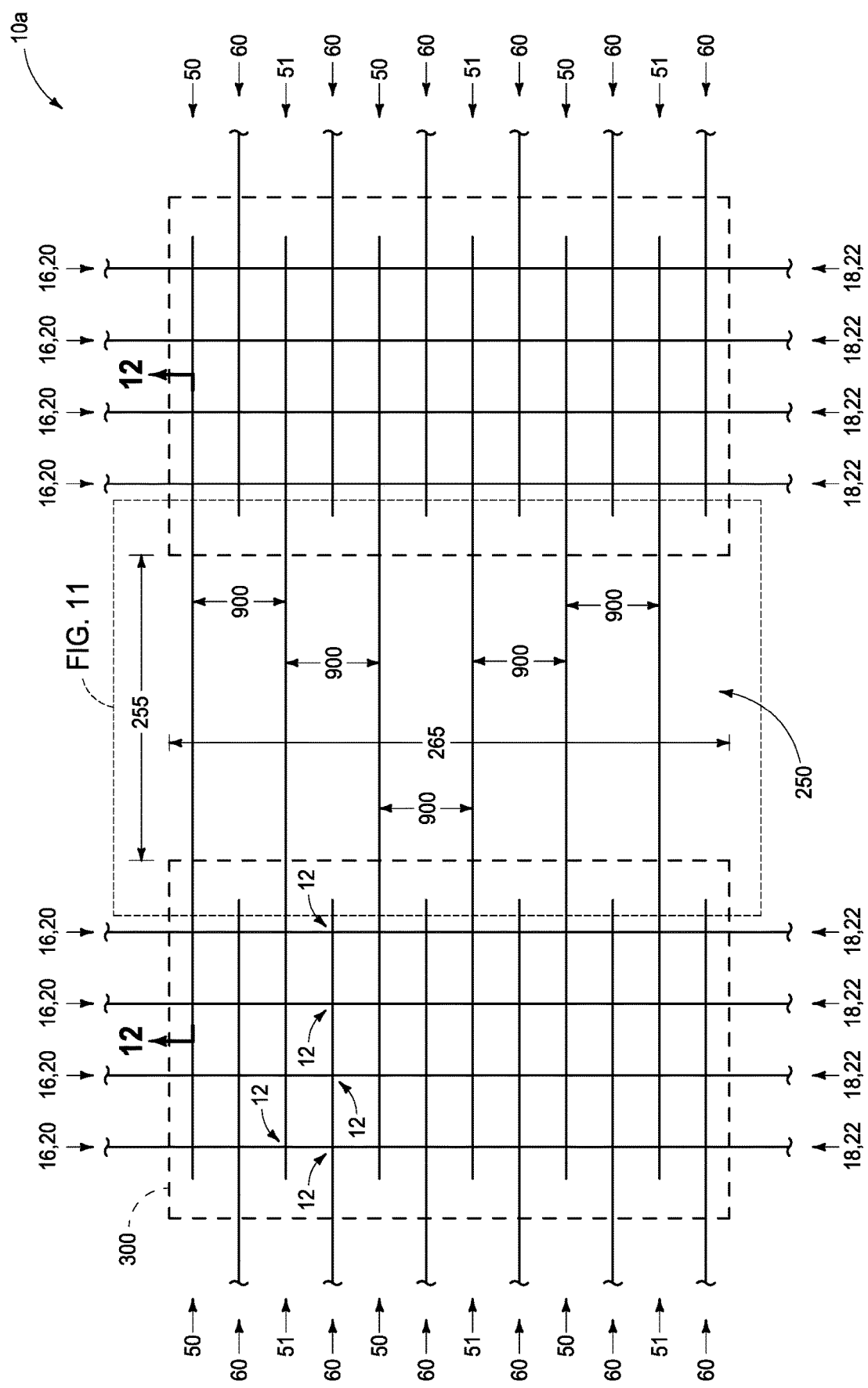

US 10,872,894 B2

MEMORY CIRCUITRY HAVING A PAIR OF IMMEDIATELY-ADJACENT MEMORY ARRAYS HAVING SPACE LATERALLY-THERE-BETWEEN THAT HAS A CONDUCTIVE INTERCONNECT IN THE SPACE

TECHNICAL FIELD

Embodiments disclosed herein pertain to memory circuitry.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field will be volatile or non-volatile. For example, a capacitor insulating material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and to read (i.e., determine) a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

A field effect transistor is another type of electronic component that may be used in a memory cell. These transistors comprise a pair of source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors may be ferroelectric wherein at least some portion of the gate construction (e.g., the gate insulator) comprises ferroelectric material. The two different polarized states of the ferroelectric material in transistors may be characterized by different threshold voltage ($V_t$) for the transistor or by different channel conductivity for a selected operating voltage.

One type of volatile memory is Dynamic Random Access Memory (DRAM). Such is used in modern computing architectures and may provide advantages of structural simplicity, low cost, and speed in comparison to other types of memory. Presently, DRAM commonly has individual memory cells that have one capacitor in combination with one field effect transistor (so-called 1T-1C memory cells), with the capacitor being coupled to one of the source/drain regions of the transistor. One of the limitations to scalability of present 1T-1C configurations is that it is difficult to incorporate capacitors having sufficiently high capacitance into highly-integrated architectures.

BRIEF DESCRIPTION OF THE DRAWINGS

FIG. 10 is a diagrammatic hybrid schematic and partial constructional view of memory circuitry.

DETAILED DESCRIPTION OF EXAMPLE EMBODIMENTS

Figure 1:
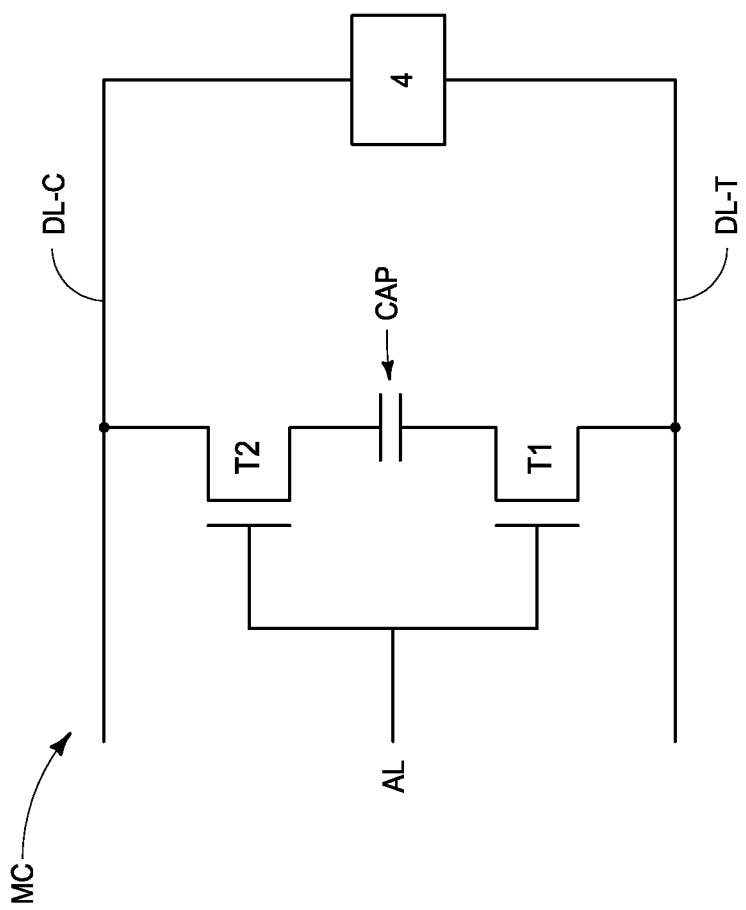
FIG. 1 is a schematic of a 2T-1C memory cell.

Embodiments of the invention include memory circuitry comprising memory cells individually having at least two transistors and at least one capacitor. In some such embodiments, the individual memory cells have no more than a total of two transistors and no more than a total of one capacitor, and which are typically referred to by persons-of-skill-in-the-art as a two transistor-one capacitor (2T-1C) memory cell and as is shown schematically in FIG. 1. An example 2T-1C memory cell MC has two transistors T1 and T2 and a capacitor CAP. A source/drain region of T1 connects with a first node of capacitor CAP and the other source/drain region of T1 connects with a first comparative digit line (e.g., DL-T). A gate of T1 connects with an access line AL (i.e., a word line). A source/drain region of T2 connects with a second node of capacitor CAP, and the other source/drain region of T2 connects with a second comparative digit line (e.g., DL-C). A gate of T2 connects with access line AL. Comparative digit lines DL-T and DL-C extend to circuitry 4 which compares electrical properties (e.g., voltage) of the two to ascertain a memory state of memory cell MC. The 2T-1C configuration of FIG. 1 may be used in DRAM and/or other types of memory.

FIGS. 2-9 show memory circuitry comprising 2T-1C memory cells 12, although memory circuitry comprising memory cells individually having more than a total of two transistors and/or more than a total of one capacitor are contemplated, and whether existing or yet-to-be-developed. The example memory circuitry comprises a substrate, construction, or device 10 that is above a base substrate 15 that may include any one or more of conductive/conductor/conducting (i.e., electrically herein), semiconductive/semiconductor semiconducting, or insulative/insulator/insulating (i.e., electrically herein) materials. Various materials have been formed above base substrate 15. Materials may be aside, elevationally inward of, or elevationally outward of the FIGS. 2-9—depicted materials. For example, other partially or wholly fabricated components of integrated circuitry may be provided somewhere above, about, or within base substrate 15. Control and/or other peripheral circuitry for operating components within an array of memory cells may also be fabricated, and may or may not be wholly or partially within an array or sub-array. Further, multiple sub-arrays may also be fabricated and operated independently, in tandem, or otherwise relative one another. As used in this document, a "sub-array" may also be considered as an array. Example base substrate 15 may comprise suitably doped semiconductor material (e.g., monocrystalline silicon).

Figure 2:
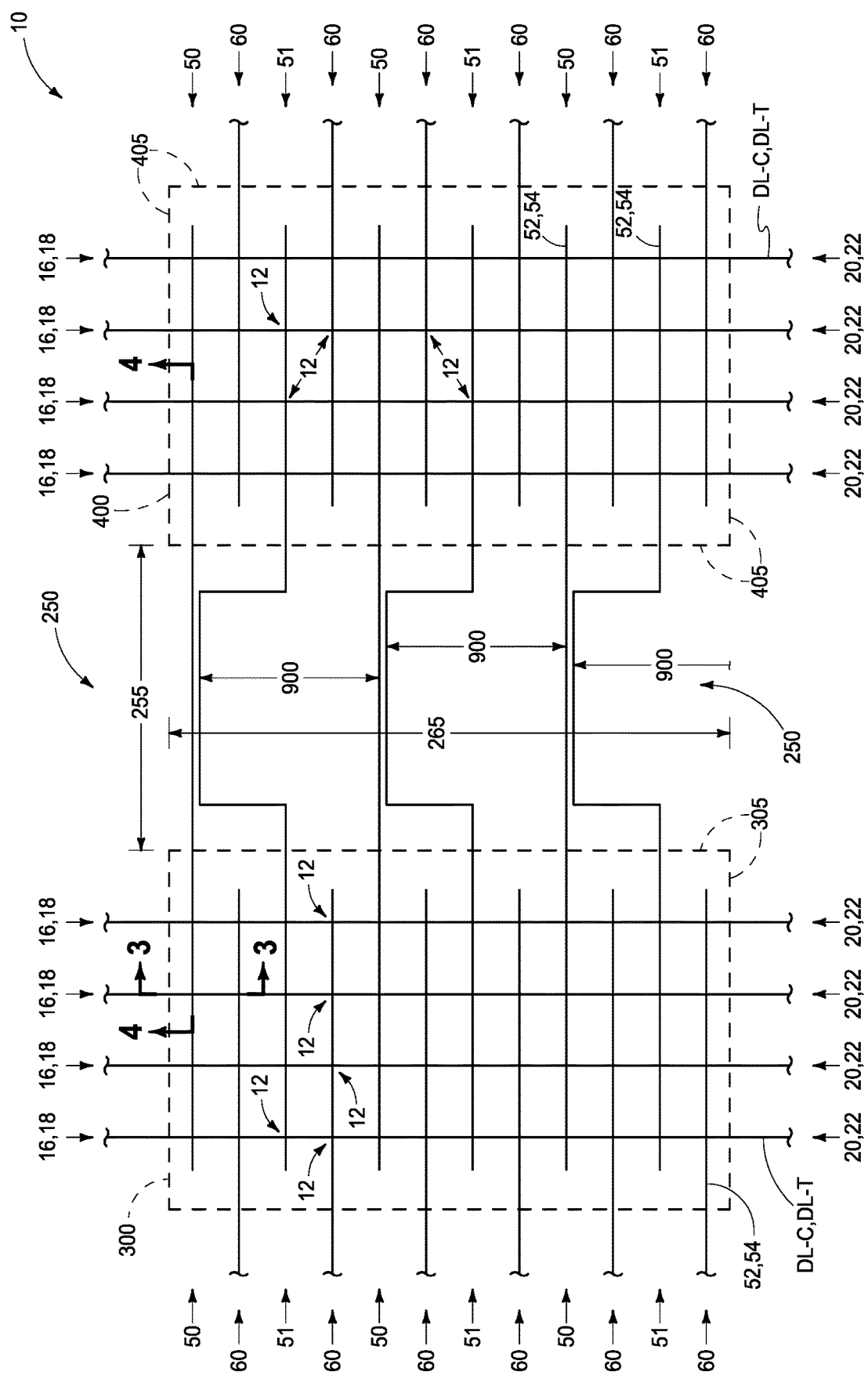
FIG. 2 is a diagrammatic hybrid schematic and partial constructional view of memory circuitry in accordance with an embodiment of the invention.
Figure 3:
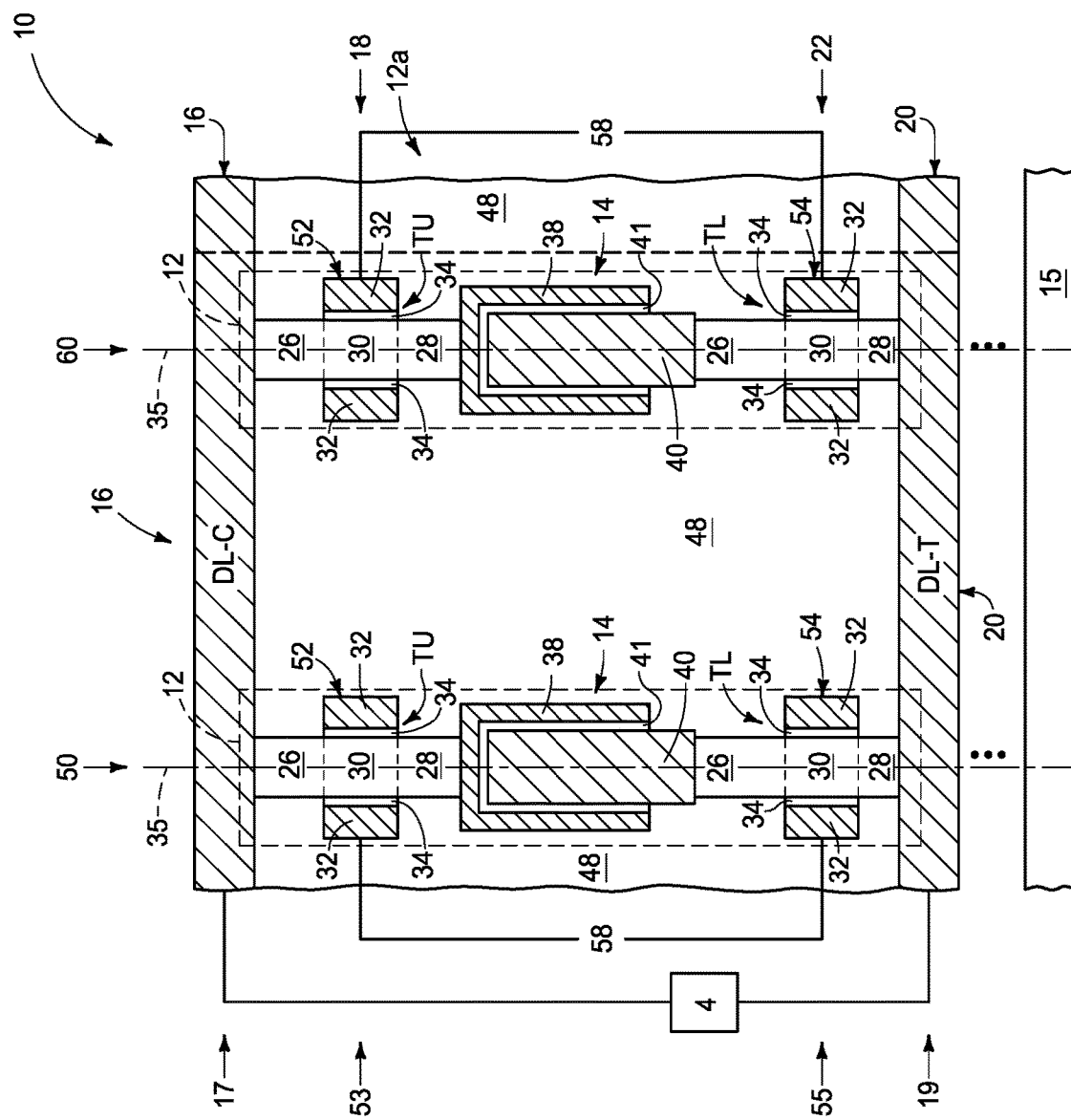
FIG. 3 is hybrid constructional and partial schematic cross-sectional view taken through line 3-3 in FIG. 2.

Construction 10 and memory circuitry in accordance with the invention comprise a pair of immediately-adjacent memory arrays 300 and 400 (e.g., 2T-1C memory arrays) having space 250 laterally there-between. Reference to "immediately-adjacent" with respect to memory arrays 300 and 400 means that there is no other memory array there-between. Reference to "immediately-adjacent" with respect to other regions, features, or components also means that there is no other such region, such feature, or such component there-between. Memory arrays 300 and 400 are shown as comprising respective perimeter outlines 305 and 405 which by way of example are shown as respective same-size squares. Alternate sizes and shapes may of course be used, and example arrays 300 and 400 need not be of the same size and/or shape relative one another. Further, perimeter outlines 305 and 405 may not be defined by a physical feature. Rather, by way of example, such may include a narrow interface region/portion at an edge of a memory array where a repeating arrangement of individual memory cells stops and space 250 starts, regardless with space 250 not having the same repeating arrangement(s) of components as within memory array 300 and/or 400. Only two side-by-side memory arrays 300 and 400 are shown in FIG. 2, although likely dozens, hundreds, thousands, etc. more (not shown) would likely be provided left and right and above and below memory arrays 300 and 400. Space 250 is shown as having lateral expanses 255 and 265 that may be of the same dimensions relative one another or may be of different dimensions one another. Space 250 is shown as being quadrilateral in shape, although any alternate shape may be used.

Memory arrays 300 and 400 individually comprise memory cells 12 that individually comprise upper elevationally-extending transistors TU (FIGS. 3 and 4) and lower elevationally-extending transistors TL and having a capacitor 14 elevationally there-between.

Memory arrays 300 and 400 comprise columns 16 of first comparative digit lines DL-C at an upper digit line level 17 above (in one embodiment directly above) and electrically coupled to (in one embodiment directly electrically coupled to) columns 18 of upper elevationally-extending transistors TU. Memory arrays 300 and 400 comprise columns 20 of second comparative digit lines DL-T at a lower digit line level 19 below (in one embodiment directly under) and electrically coupled to (in one embodiment directly electrically coupled to) columns 22 of lower elevationally-extending transistors TL. Example transistors TU and TL individually comprise an upper source/drain region 26, a lower source/drain region 28, and a channel region 30 elevationally there-between. A transistor gate 32 is shown as being on opposite sides of channel region 30, and separated therefrom by a gate insulator 34. Source/drain regions 26, 28 may be heavily doped with a conductivity-enhancing impurity to be electrically conductive, for example having a dopant concentration of at least $10^{20}$ atoms/cm$^3$. Channel region 30 may be suitably doped with a conductivity-modifying impurity likely of the opposite conductivity-type of the dopant in regions 26 and 28, for example to a channel dopant concentration less than or equal to about $10^{16}$ atoms/cm$^3$. Conductive components, features, regions, and materials herein may comprise, consist essentially of, or consist of one or more of conductively-doped semiconductive material(s) and/or metal material(s).

In one embodiment and as shown, upper elevationally-extending transistor TU is vertical or within 10° of vertical and lower elevationally-extending transistor TL is vertical or within 10° of vertical. In one such embodiment and as shown, upper and lower elevationally-extending transistors in individual memory cells 12 share a common straight-line axis 35 along which current flows in operation through channel 30 of the respective upper and lower elevationally-extending transistors. In one embodiment and as shown, lower source/drain region 28 of lower transistor TL is directly electrically coupled to comparative digit line DL-T, and in one embodiment upper source/drain region 26 of upper transistor TU is directly electrically coupled to comparative digit line DL-C. The elevational positions of DL-T and DL-C may be reversed.

Capacitor 14 comprises an upper electrode 38, a lower electrode 40, and a capacitor insulator 41 there-between. Lower capacitor electrode 40 is shown as a conductive pillar and upper capacitor electrode 38 is shown as a downwardly-facing container encircling an upper portion of lower electrode pillar 40. Such relationship may be reversed whereby, for example, the lower capacitor electrode is an upwardly facing container and the upper capacitor electrode is a downwardly projecting pillar. Any alternate capacitor construction may be used, for example comprising no container-like structure and/or no pillar.

Memory arrays 300 and 400 share first alternating rows 50, 51 and second alternating rows 60. Second alternating rows 60 individually are between immediately-adjacent first alternating rows 50 and 51. Individual of first alternating rows 50, 51 and second alternating rows 60 have an upper access line 52 in an upper access line level 53 above a lower access line 54 in a lower access line level 55. Individual upper access lines 52 and lower access lines 54 are shown as being laterally offset from one another in FIG. 5 at least for clarity in such figure. Lines 52 and 54 may not be so offset and regardless need not be of the same size and shape relative one another.

Upper access line 52 and lower access line 54 in individual first alternating rows 50, 51 and in individual second alternating rows 60 are directly electrically coupled together by a conductor interconnect 58. Such interconnect comprises a horizontally-extending portion 62 within upper digit line level 17 that is directly above both of upper access line 52 and lower access line 54 in that individual first alternating row 50, 51 or second alternating row 60. Individual first alternating rows 50 in memory arrays 300 and 400 are directly coupled to one another across space 250. Individual first alternating rows 51 in memory arrays 300 and 400 are directly electrically coupled to one another across space 250. Individual second alternating rows 60 in memory arrays 300 and 400 are not directly electrically coupled to one another across space 250.

Lower access line 54 in alternating ones 50 of first alternating rows 50, 51 extend across space 250 from one of memory arrays 300, 400 to the other of memory arrays 300, 400. Lower access line 54 in alternating others 51 of first alternating rows 50, 51 do not extend across space 250 from one of memory arrays 300, 400 to the other of memory arrays 300, 400. Alternating others 51 of first alternating rows 50, 51 are individually between immediately-adjacent of alternating ones 50 of first alternating rows 50, 51. Individual of alternating other first alternating rows 51 in memory arrays 300, 400 are directly electrically coupled to one another across space 250 by a conductive interconnect 66. Such interconnect includes one horizontally-elongated portion 65 in space 250 in upper digit line level 17 and another horizontally-elongated portion 67 in space 250 in upper access line level 53. Such another horizontally-elongated portion 67 in space 250 is directly above lower access line 54 in an immediately-adjacent one of alternating ones 50 of first alternating rows 50, 51. Individual conductor interconnects 58 and conductive interconnects 66 may abut end-to-end and/or otherwise be integral with one another.

In one embodiment, multiple conductive vias 95 extend from upper digit line level 17 to lower digit line level 19 (in one embodiment from above level 17 to below level 19) within space 250 laterally between two immediately-adjacent alternating ones 50, 51 of first alternating rows 50, 51.

Example insulating material 48 (e.g., silicon dioxide and/or silicon nitride) is shown encapsulating the various features and components described above.

In some embodiments, and unless otherwise stated independent of one or more of the aspects described above, memory circuitry comprises a pair of immediately-adjacent memory arrays (e.g., 300 and 400) having space (e.g., 250) laterally there-between. Nevertheless, any other attribute(s) or aspect(s) as shown and/or described herein with respect to other embodiments may be used. The memory arrays individually comprise memory cells (e.g., 12) individually having an upper elevationally-extending transistor (e.g., TU) and a lower elevationally-extending transistor (e.g., TL) and a capacitor (e.g., 14) elevationally there-between. The memory arrays comprise individual rows (e.g., any two or more of rows 50, 51, 60) that (a) have an upper access line (e.g., 52) above and directly electrically coupled to a lower access line (e.g., 54), and (b) are directly electrically coupled to one another across the space. The lower access line in one of the rows (e.g., any one of rows 50) extends across the space from one of the memory arrays to the other of the memory arrays. Another of the rows (e.g., any one of rows 51) comprises a conductive interconnect (e.g., 66) including a horizontally-extending portion (e.g., 67) within the space that is laterally offset from the another row.

In one embodiment, the upper access lines are directly above the lower access lines at least within the one and the other of the memory arrays. In one embodiment, the upper access line in the one row (e.g., 50) does not extend across the space from the one memory array to the other memory array. In one embodiment, the horizontally-extending portion of the conductive interconnect and a horizontally-extending portion of the upper access line are in a common horizontal plane (e.g., the horizontal plane as exemplified by level 53). In one embodiment, the horizontally-extending portion of the conductive interconnect is within the one row (e.g., 67 within any one row 50). In one such embodiment, the horizontally-extending portion of the conductive interconnect is directly above the lower access line in the one row.

In one embodiment, the upper and lower access lines in the individual rows are directly electrically coupled to one another with conductive material (e.g., 72 and/or 74) that is above the upper access lines. In one such embodiment, such conductive material (e.g., 74) is directly above the upper access line in the space. Further in one such latter embodiment, the conductive material (e.g., 74) is directly above the lower access line in the space. In one embodiment, the upper and lower access lines in the individual rows are directly electrically coupled to one another with a first conductive via (e.g., 71) that contacts an uppermost surface (e.g., 81) of the upper access line and with a second conductive via (e.g., 73) that contacts an uppermost surface (e.g., 83) of the lower access line. In one such embodiment, the upper and lower access lines in the individual rows are directly electrically coupled to one another with conductive material (e.g., 72 in combination with 74) that is above the upper access lines and directly against uppermost surfaces of each of the first and second conductive vias.

In one embodiment, the horizontally-extending portion (e.g., 67) of the conductive interconnect is horizontally elongated. In one such embodiment, the horizontally-elongated portion of the conductive interconnect is totally laterally offset from the another row (e.g., 51). In one embodiment, the memory cells individually are 2T-1C memory cells.

Any other attribute(s) or aspect(s) as shown and/or described herein with respect to other embodiments may be used.

In some embodiments, and unless otherwise stated independent of one or more of the aspects described above, memory circuitry comprises a pair of immediately-adjacent memory arrays (e.g., 300 and 400) having space (e.g., 250) laterally there-between. Nevertheless, any other attribute(s) or aspect(s) as shown and/or described herein with respect to other embodiments may be used. The memory arrays individually comprise memory cells (e.g., 12) individually having an upper elevationally-extending transistor (e.g., TU) and a lower devotionally-extending transistor (e.g., TL) and a capacitor (e.g., 14) devotionally there-between. The memory arrays comprise individual rows (e.g., any of rows 50, 51, or 60) that (a) have an upper access line (e.g., 52) above and directly electrically coupled to a lower access line (e.g., 54), and (b) are directly coupled to one another across the space. The lower access line in one of the rows (e.g., any one of rows 50) extends across the space from one of the memory arrays to the other of the memory arrays. Another of the rows (e.g., any one of rows 51) comprises a conductive interconnect (e.g., 66) that includes a horizontally-elongated portion (e.g., 67) extending across a portion of the space and that is longitudinally-aligned in and with the one row. Any other attribute(s) or aspect(s) as shown and/or described herein with respect to other embodiments may be used.

Figures 4, 5:
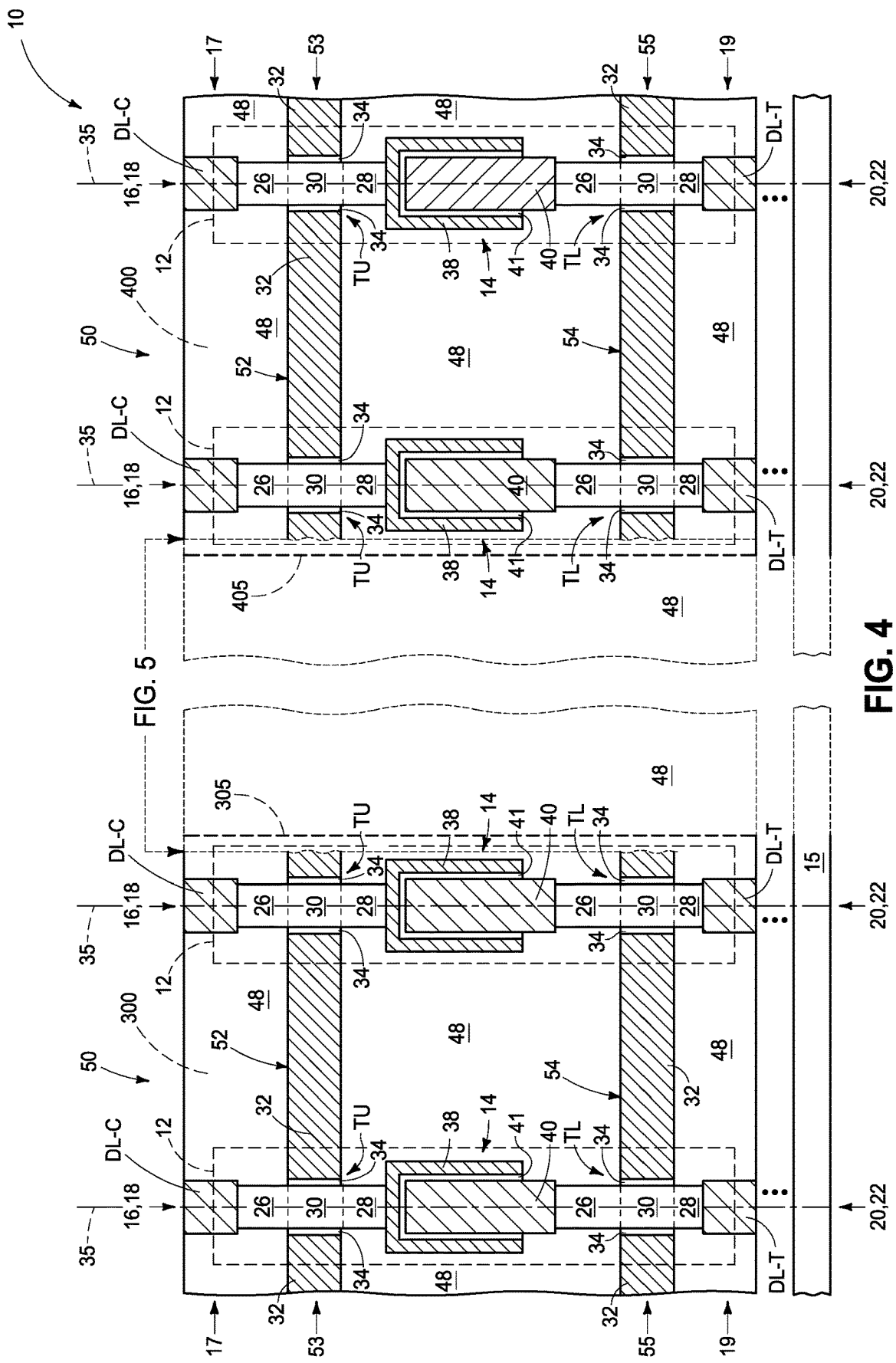
FIG. 4 is a fragmented cross-sectional view taken through line 4-4 in FIG. 2.
FIG. 5 is a diagrammatic enlarged top view of a portion of FIG. 2 and as shown in FIG. 4.
Figure 5:
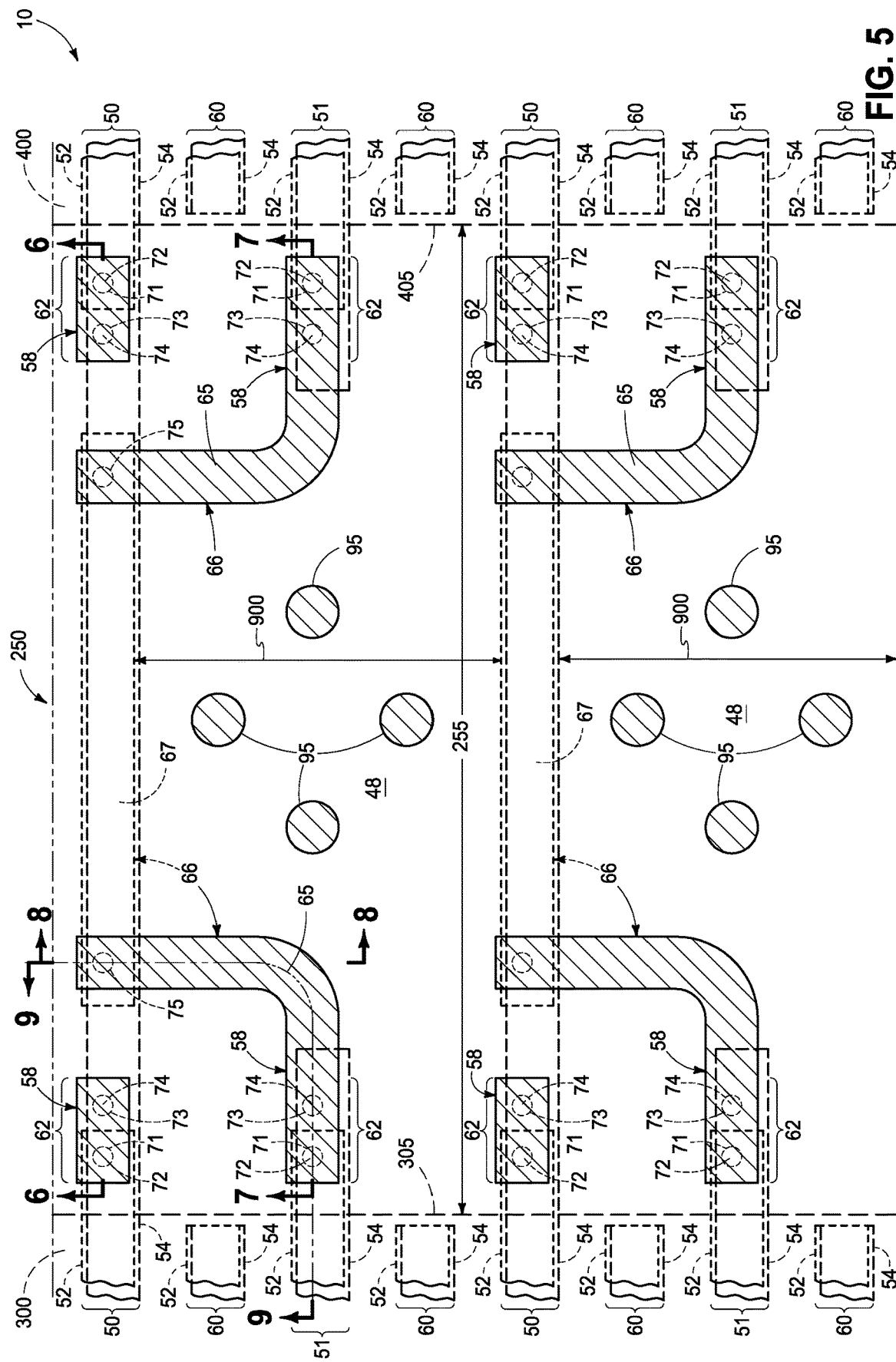
Figure 6:
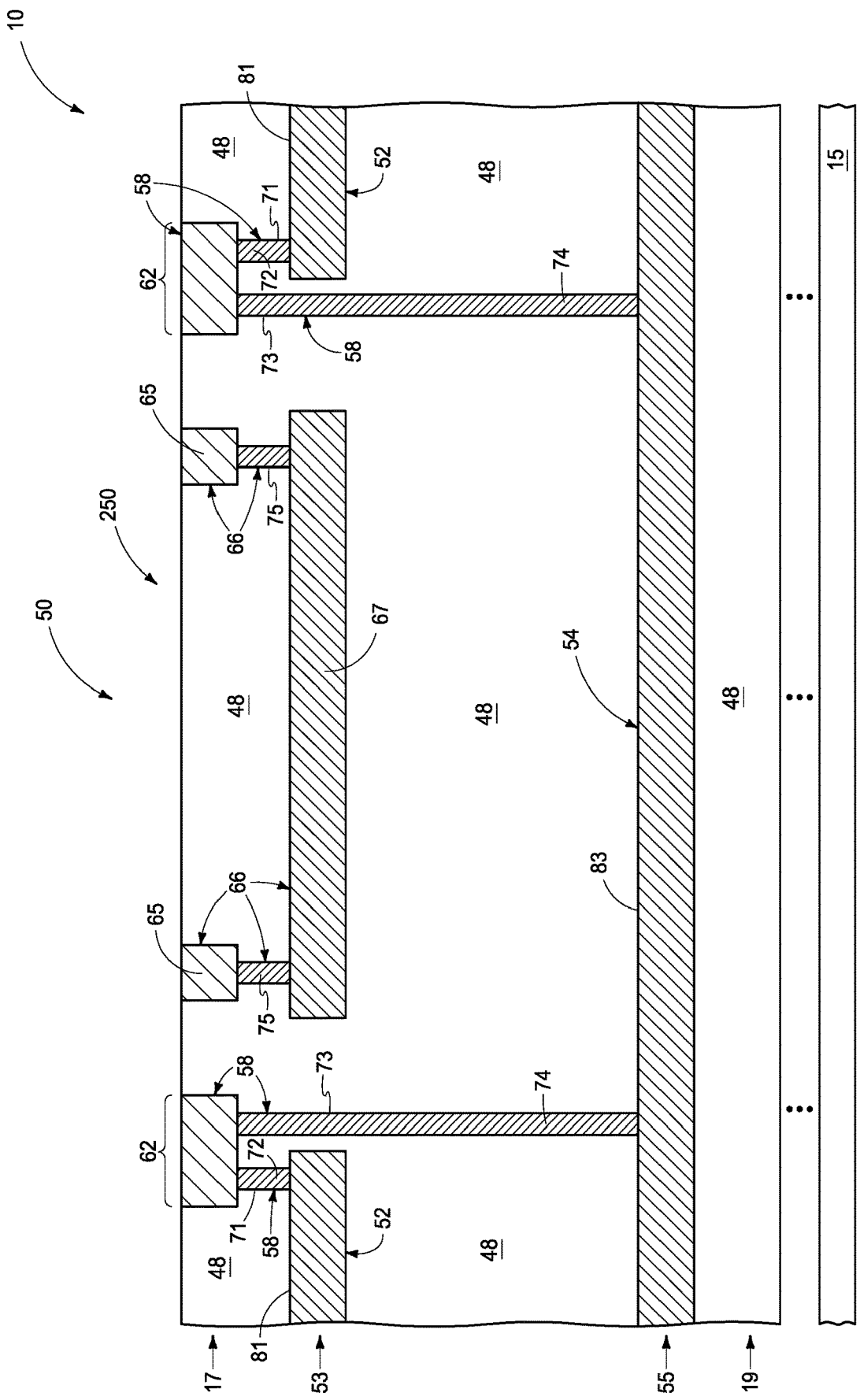
FIG. 6 is a cross-sectional view taken through line 6-6 in FIG. 5.
Figure 7:
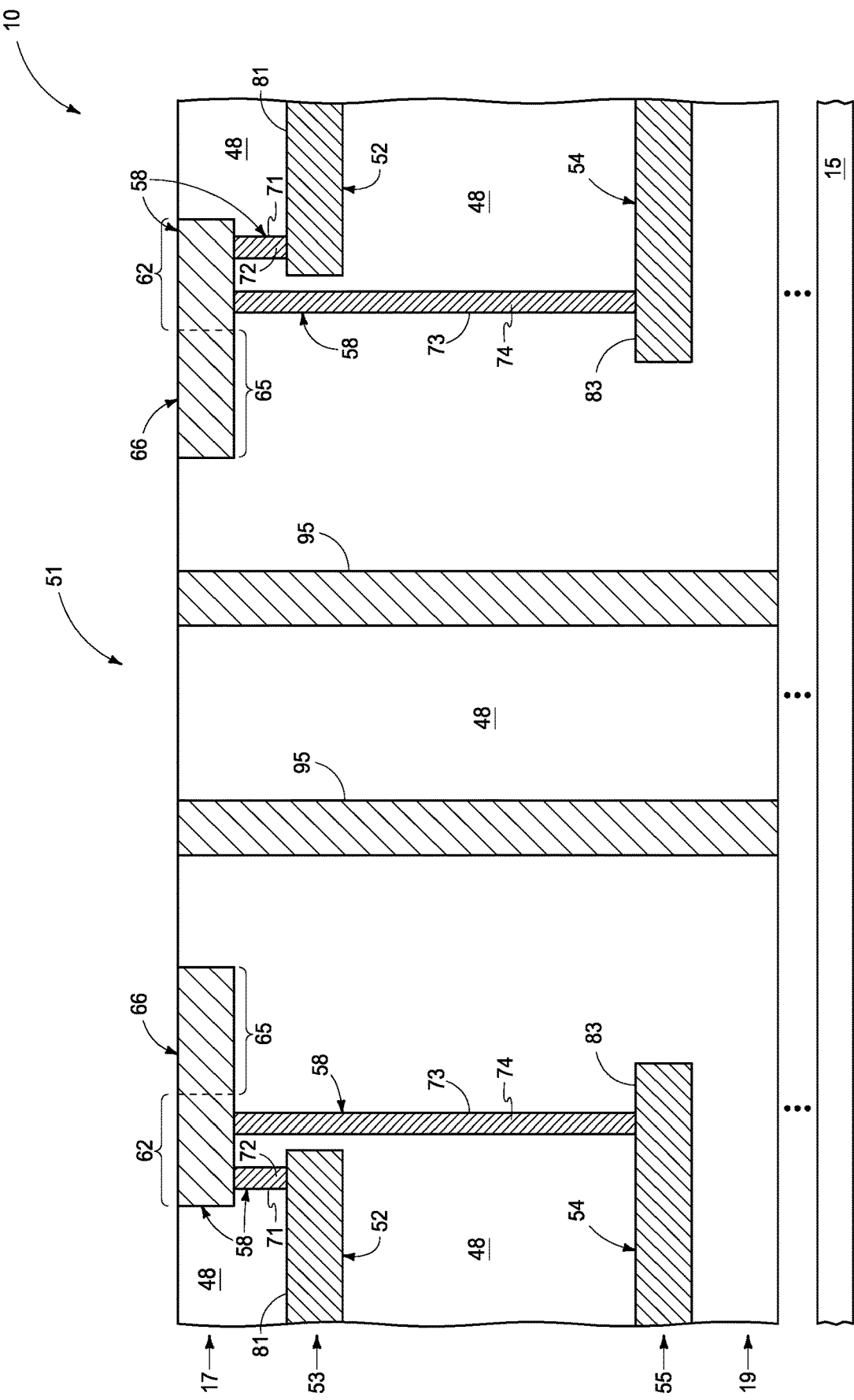
FIG. 7 is a cross-sectional view taken through line 7-7 in FIG. 5.
Figure 9:
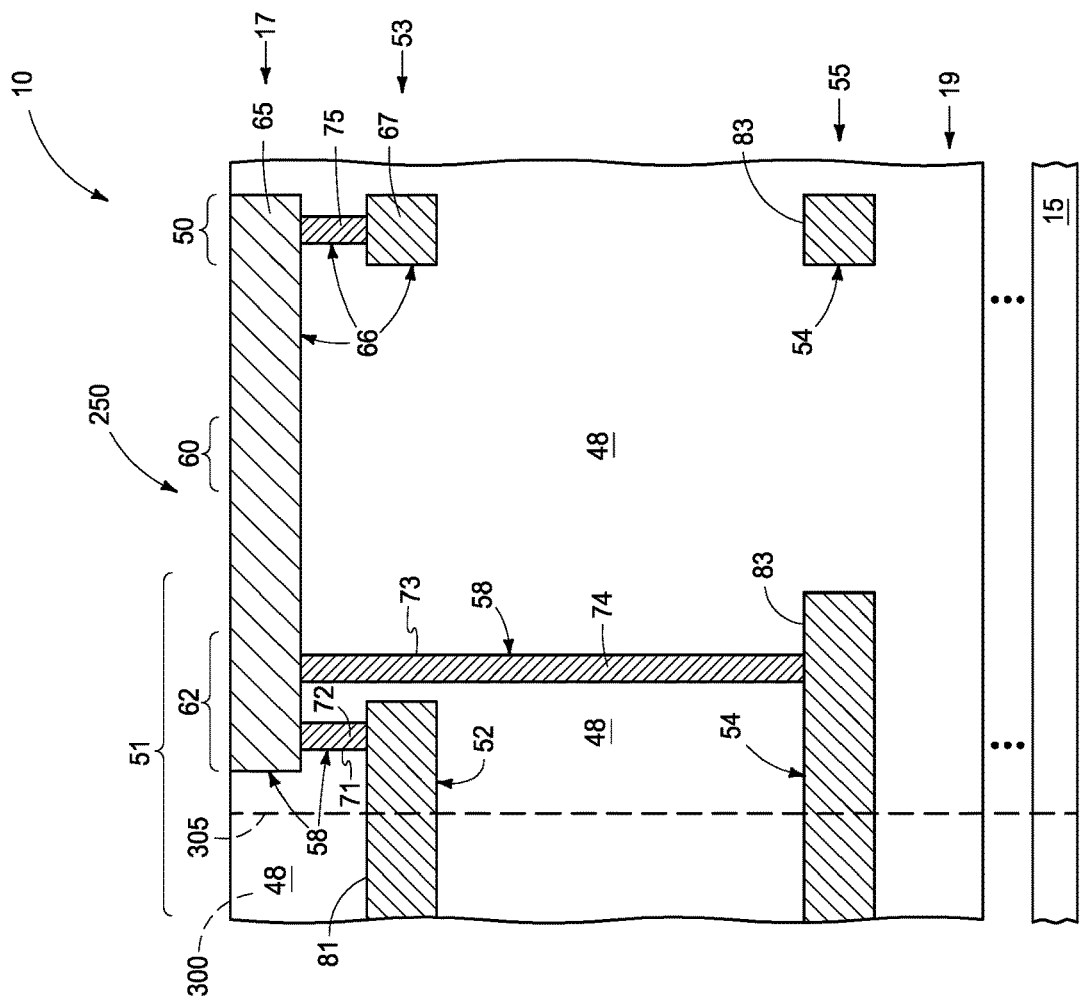
FIG. 9 is a cross-sectional view taken through line 9-9 in FIG. 5.
Figure 8:
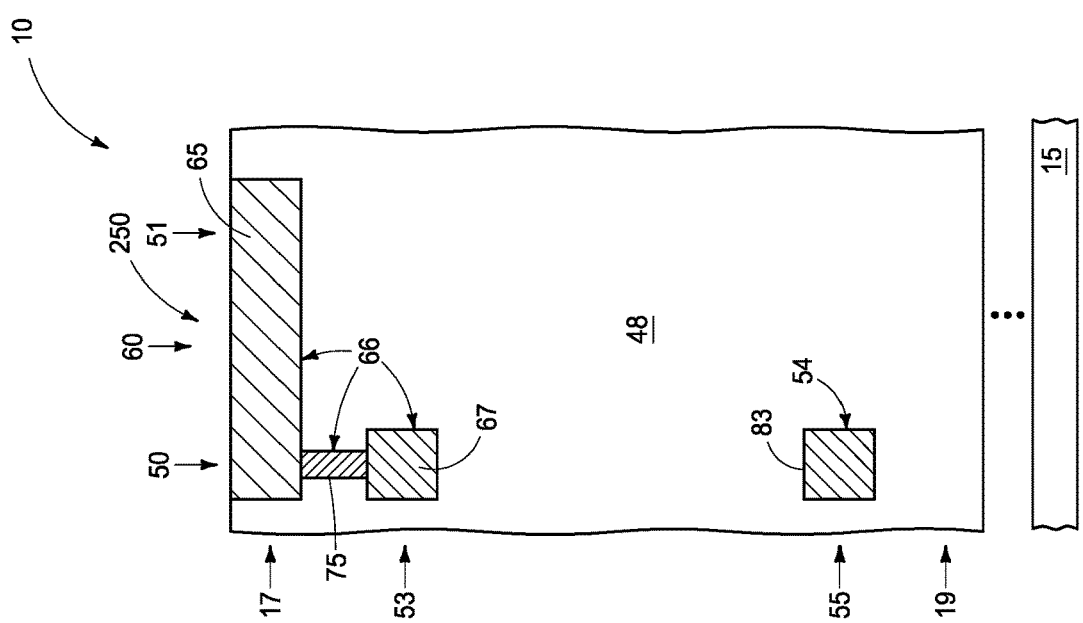
FIG. 8 is a cross-sectional view taken through line 8-8 in FIG. 5.
Figure 11:
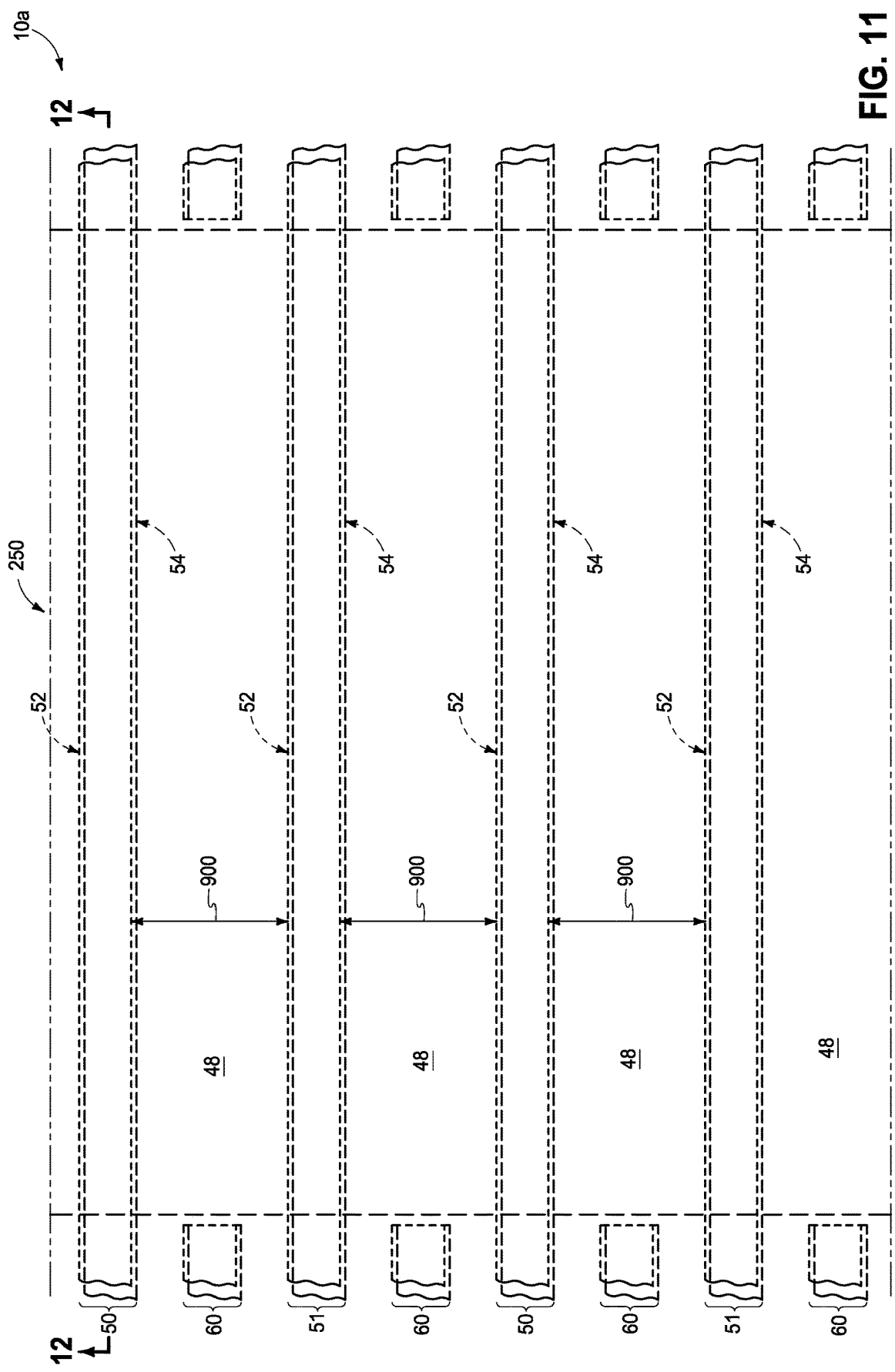
FIG. 11 is a diagrammatic enlarged top view of a portion of FIG. 10.
Figure 12:
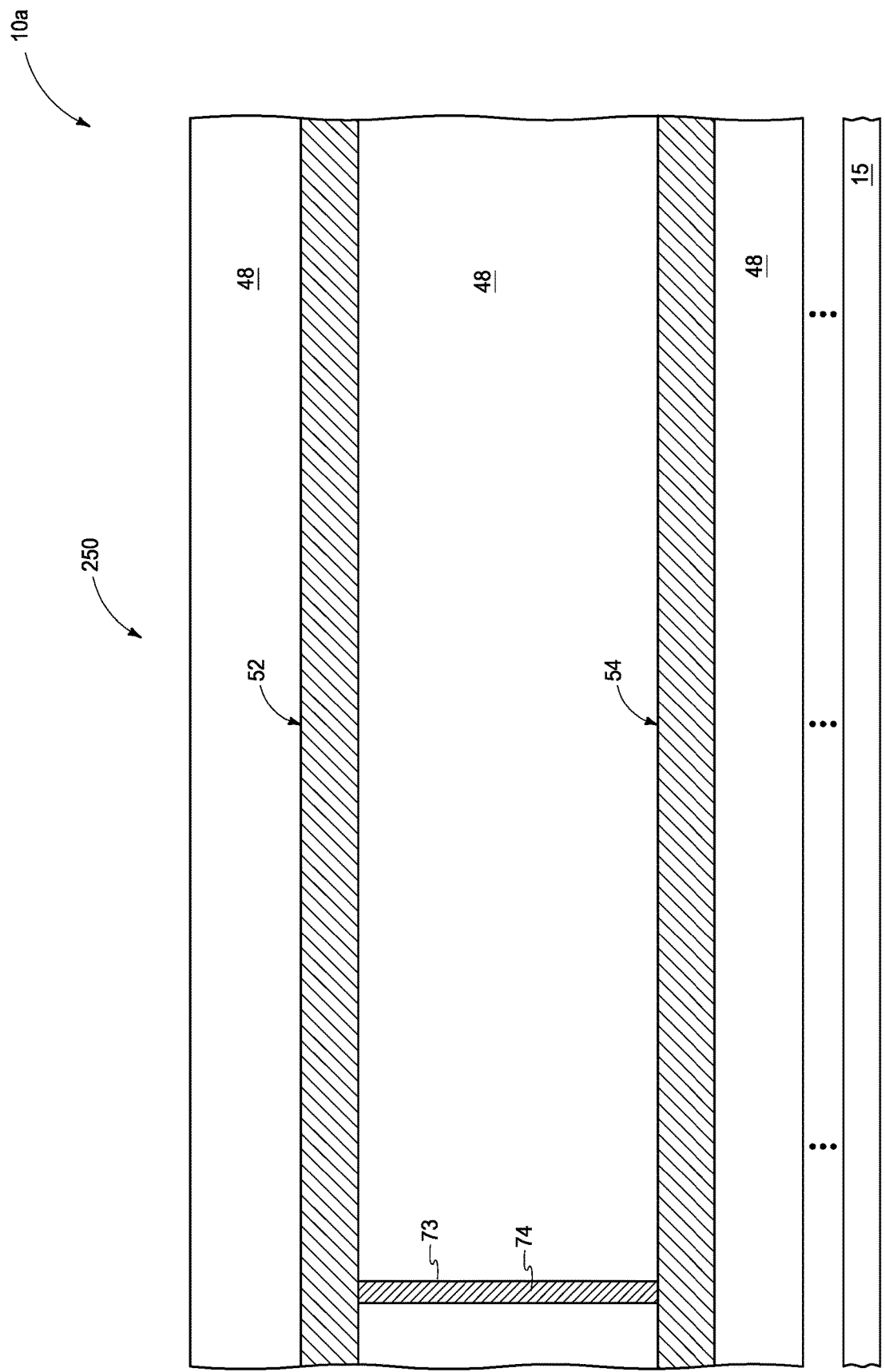
FIG. 12 is a cross-sectional view taken through line 12-12 in FIG. 11.

Embodiments as described above may in some implementations provide an advantage over that described below with respect to a construction 10a in FIGS. 10-12. Like numerals from the above-described embodiments have been used for like constructions, features, and materials. In many instances, conductive interconnects (e.g., 95 in FIGS. 5 and 7) are provided within area between immediately-adjacent memory arrays to interconnect circuitry that is above such arrays to circuitry that is below such arrays. As the rows of certain access lines that extend between immediately-adjacent arrays become closer together, the tendency has been towards lesser available area between those rows within which to position through-array conductive vias for making such electrical interconnections. For example, and by way of example only, FIGS. 10 and 11 show an expanse 900 between immediately-adjacent rows 50 and 51 that is available for making such conductive via interconnections. A corresponding expanse 900 as shown in FIGS. 2 and 5 in the above-described embodiments may be significantly increased, in one embodiment approximately doubled, in comparison to that available in construction 10a.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Use of "row" and "column" in this document is for convenience in distinguishing one series or orientation of features from another series or orientation of features and along which components have been or will be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles.

Additionally, "metal material" is any one or combination of an elemental metal, a mixture or an alloy of two or more elemental metals, and any conductive metal compound.

CONCLUSION

In some embodiments, memory circuitry comprises a pair of immediately-adjacent memory arrays having space laterally there-between. The memory arrays individually comprise memory cells individually having upper and lower elevationally-extending transistors and a capacitor elevationally there-between. The memory arrays comprise individual rows that (a) have an upper access line above and directly electrically coupled to a lower access line, and (b) are directly electrically coupled to one another across the space. The lower access line in one of the rows extends across the space from one of the memory arrays to the other of the memory arrays. Another of the rows comprises a conductive interconnect extending across a portion of the space. The conductive interconnect includes a horizontally-extending portion within the space that is laterally offset from the another row.

In some embodiments, memory circuitry comprises a pair of immediately-adjacent memory arrays having space laterally there-between. The memory arrays individually comprise memory cells individually having upper and lower elevationally-extending transistors and a capacitor elevationally there-between. The memory arrays comprise individual rows that (a) have an upper access line above and directly electrically coupled to a lower access line, and (b) are directly electrically coupled to one another across the space. The lower access line in one of the rows extends across the space from one of the memory arrays to the other of the memory arrays. Another of the rows comprises a conductive interconnect that includes a horizontally-elongated portion extending across a portion of the space and that is longitudinally-aligned in and with the one row.

In some embodiments, memory circuitry comprising two transistor-one capacitor (2T-1C) memory cells comprising a pair of immediately-adjacent 2T-1C memory arrays having space laterally there-between. The 2T-1C memory arrays individually comprise 2T-1C memory cells individually comprising upper and lower elevationally-extending transistors having a capacitor elevationally there-between. The 2T-1C memory arrays comprise columns of first comparative digit lines at an upper digit line level above and electrically coupled to columns of the upper elevationally-extending transistors. The 2T-1C memory arrays comprise columns of second comparative digit lines at a lower digit line level below and electrically coupled to columns of the lower elevationally-extending transistors. The 2T-1C memory arrays share first alternating rows and second alternating rows. The second alternating rows individually are between immediately-adjacent of the first alternating rows. Individual of the first and second alternating rows have an upper access line in an upper access line level above a lower access line in a lower access line level. The upper access line and the lower access line in the individual first alternating rows and in the individual second alternating rows are directly electrically coupled together by a conductor interconnect that includes a horizontally-extending portion within the upper digit line level that is directly above both of the upper access line and the lower access line in that individual first or second alternating row. The individual first alternating rows in the 2T-1C memory arrays are directly electrically coupled to one another across the space. The individual second alternating rows in the 2T-1C memory arrays are not directly electrically coupled to one another across the space. The lower access line in alternating ones of the first alternating rows extends across the space from one of the 2T-1C memory arrays to the other of the 2T-1C memory arrays. The lower access line in alternating others of the first alternating rows do not extend across the space from one of the 2T-1C memory arrays to the other of the 2T-1C memory arrays. The alternating other first alternating rows individually are between immediately-adjacent of the alternating ones of the first alternating rows. Individual of the alternating other first alternating rows in the one and the other 2T-1C memory arrays are directly electrically coupled to one another across the space by a conductive interconnect that includes one horizontally-elongated portion in the space in the upper digit line level and another horizontally-elongated portion in the space in the upper access line level. The another horizontally-elongated portion in the space is directly above the lower access line in an immediately-adjacent one of the alternating ones of the first alternating rows.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. Memory circuitry comprising:
   a pair of immediately-adjacent memory arrays having space laterally there-between, the memory arrays individually comprising memory cells individually having upper and lower elevationally-extending transistors and a capacitor elevationally there-between;
   the memory arrays comprising individual rows that (a) have an upper access line above and directly electrically coupled to a lower access line, and (b) are directly electrically coupled to one another across the space;
   the lower access line in one of the rows extending across the space from one of the memory arrays to the other of the memory arrays; and
   another of the rows comprising a conductive interconnect extending across a portion of the space, the conductive interconnect including a horizontally-extending portion within the space that is laterally offset from the another row.

2. The memory circuitry of claim 1 wherein the upper access lines are directly above the lower access lines at least within the one and the other of the memory arrays.

3. The memory circuitry of claim 1 wherein the upper and lower elevationally-extending transistors are vertical or within 10° of vertical.

4. The memory circuitry of claim 3 wherein the upper and lower elevationally-extending transistors in the individual memory cells share a common straight-line axis along which current flows in operation through a channel of the respective upper and lower elevationally-extending transistors.

5. The memory circuitry of claim 1 wherein the upper access line in the one row does not extend across the space from the one memory array to the other memory array.

6. The memory circuitry of claim 1 wherein the horizontally-extending portion of the conductive interconnect and a horizontally-extending portion of the upper access line are in a common horizontal plane.

7. The memory circuitry of claim 1 wherein the horizontally-extending portion of the conductive interconnect is within the one row.

8. The memory circuitry of claim 7 wherein the horizontally-extending portion of the conductive interconnect is directly above the lower access line in the one row.

9. The memory circuitry of claim 1 wherein the upper and lower access lines in the individual rows are directly electrically coupled to one another with conductive material that is above the upper access lines.

10. The memory circuitry of claim 9 wherein the conductive material is directly above the upper access line in the space.

11. The memory circuitry of claim 10 wherein the conductive material is directly above the lower access line in the space.

12. The memory circuitry of claim 1 wherein the upper and lower access lines in the individual rows are directly electrically coupled to one another with a first conductive via that contacts an uppermost surface of the upper access line and with a second conductive via that contacts an uppermost surface of the lower access line.

13. The memory circuitry of claim 12 wherein the upper and lower access lines in the individual rows are directly electrically coupled to one another with conductive material that is above the upper access lines and directly against uppermost surfaces of each of the first and second conductive vias.

14. The memory circuitry of claim 1 wherein the horizontally-extending portion of the conductive interconnect is horizontally elongated.

15. The memory circuitry of claim 14 the horizontally-elongated portion of the conductive interconnect is totally laterally offset from the another row.

16. The memory circuitry of claim 1 wherein the memory cells individually are two transistor-one capacitor (2T-1C) memory cells.

17. The memory circuitry of claim 1 comprising multiple conductive vias extending from the upper digit line level to the lower digit line level within the space laterally of the horizontally-extending portion of the conductive interconnect.

18. Memory circuitry comprising:
a pair of immediately-adjacent memory arrays having space laterally there-between, the memory arrays individually comprising memory cells individually having upper and lower elevationally-extending transistors and a capacitor elevationally there-between;
the memory arrays comprising individual rows that (a) have an upper access line above and directly electrically coupled to a lower access line, and (b) are directly electrically coupled to one another across the space;
the lower access line in one of the rows extending across the space from one of the memory arrays to the other of the memory arrays; and
another of the rows comprising a conductive interconnect that includes a horizontally-elongated portion extending across a portion of the space and that is longitudinally-aligned in and with the one row.

19. Memory circuitry comprising two transistor-one capacitor (2T-1C) memory cells, comprising:
a pair of immediately-adjacent 2T-1C memory arrays having space laterally there-between, the 2T-1C memory arrays individually comprising 2T-1C memory cells individually comprising upper and lower elevationally-extending transistors having a capacitor elevationally there-between;
the 2T-1C memory arrays comprising columns of first comparative digit lines at an upper digit line level above and electrically coupled to columns of the upper elevationally-extending transistors, the 2T-1C memory arrays comprising columns of second comparative digit lines at a lower digit line level below and electrically coupled to columns of the lower elevationally-extending transistors;
the 2T-1C memory arrays sharing first alternating rows and second alternating rows, the second alternating rows individually being between immediately-adjacent of the first alternating rows, individual of the first and second alternating rows having an upper access line in an upper access line level above a lower access line in a lower access line level, the upper access line and the lower access line in the individual first alternating rows and in the individual second alternating rows being directly electrically coupled together, the upper access line and the lower access line in the individual first alternating rows being directly electrically coupled together by a conductor interconnect that includes a horizontally-extending portion within the upper digit line level that is directly above both of the upper access line and the lower access line in that individual first alternating row, the individual first alternating rows in the 2T-1C memory arrays being directly electrically coupled to one another across the space, the individual second alternating rows in the 2T-1C memory arrays not being directly electrically coupled to one another across the space;
the lower access line in alternating ones of the first alternating rows extending across the space from one of the 2T-1C memory arrays to the other of the 2T-1C memory arrays, the upper access line in alternating others of the first alternating rows not extending across the space from one of the 2T-1C memory arrays to the other of the 2T-1C memory arrays, the alternating other first alternating rows individually being between immediately-adjacent of the alternating ones of the first alternating rows; and
individual of the alternating other first alternating rows in the one and the other 2T-1C memory arrays being directly electrically coupled to one another across the space by a conductive interconnect that includes one horizontally-elongated portion in the space in the upper digit line level and another horizontally-elongated portion in the space in the upper access line level, the another horizontally-elongated portion in the space being directly above the lower access line in an immediately-adjacent one of the alternating ones of the first alternating rows.

20. The memory circuitry of claim 19 comprising multiple conductive vias extending from the upper digit line level to the lower digit line level within the space laterally between two immediately-adjacent of alternating ones of the first alternating rows.

* * * * *